(12) United States Patent
Wilson et al.

(10) Patent No.: US 11,543,296 B2
(45) Date of Patent: Jan. 3, 2023

(54) METHOD AND APPARATUS FOR CALIBRATION OF SUBSTRATE TEMPERATURE USING PYROMETER

(71) Applicant: Applied Materials, Inc., Santa Clara, CA (US)

(72) Inventors: Eric D. Wilson, Rockport, MA (US); Steven Anella, West Newbury, MA (US); D. Jeffrey Lischer, Acton, MA (US); James McLane, Beverly, MA (US); Bradley M. Pomerleau, Beverly, MA (US); Dawei Sun, Lynnfield, MA (US)

(73) Assignee: Applied Materials, Inc., Santa Clara, CA (US)

( * ) Notice: Subject to any disclaimer, the term of this patent is extended or adjusted under 35 U.S.C. 154(b) by 719 days.

(21) Appl. No.: 16/551,128

(22) Filed: Aug. 26, 2019

(65) Prior Publication Data

US 2020/0378832 A1    Dec. 3, 2020

Related U.S. Application Data

(60) Provisional application No. 62/855,465, filed on May 31, 2019.

(51) Int. Cl.
*G01J 5/00*       (2022.01)
*H01L 21/67*      (2006.01)
(Continued)

(52) U.S. Cl.
CPC ...... *G01J 5/0007* (2013.01); *H01L 21/67248* (2013.01); *G01J 5/026* (2013.01);
(Continued)

(58) Field of Classification Search
CPC .......... G01J 5/0007; G01J 5/026; G01J 5/802; H01L 21/67248; H01L 21/67098; H01L 21/67115; H01L 21/68714; G01K 7/02
See application file for complete search history.

(56) References Cited

U.S. PATENT DOCUMENTS 2,620,664 A * 12/1952 Lodge .................. G01K 7/14
                                                374/183
4,952,808 A *  8/1990 Turnbull ................ H04N 5/33
                                                250/338.3
(Continued)

FOREIGN PATENT DOCUMENTS

JP    2000-012664 A    1/2000
KR   10-2009-0015335 A   2/2009
(Continued)

OTHER PUBLICATIONS

International Search Report and Written Opinion dated Aug. 27, 2020, for the International Patent Application No. PCT/US2020/031513, filed on May 5, 2020, 8 pages.

*Primary Examiner* — Nathaniel T Woodward
*Assistant Examiner* — Philip L Cotey
(74) *Attorney, Agent, or Firm* — KDB Firm PLLC (57) ABSTRACT

A method may include heating a substrate in a first chamber to a platen temperature, the heating comprising heating the substrate on a platen; measuring the platen temperature in the first chamber using a contact temperature measurement; transferring the substrate to a second chamber after the heating; and measuring a voltage decay after transferring the substrate to the second chamber, using an optical pyrometer to measure pyrometer voltage as a function of time.

20 Claims, 8 Drawing Sheets

(51) Int. Cl.
*G01J 5/80* (2022.01)
*G01J 5/02* (2022.01)
*G01K 7/02* (2021.01)
*H01L 21/687* (2006.01)

(52) U.S. Cl.
CPC ............... *G01J 5/802* (2022.01); *G01K 7/02* (2013.01); *H01L 21/67098* (2013.01); *H01L 21/67115* (2013.01); *H01L 21/68714* (2013.01)

(56) References Cited

U.S. PATENT DOCUMENTS

| | | | | |
|---|---|---|---|---|
| 4,984,902 | A * | 1/1991 | Crowley | G01J 5/0007 374/129 |
| 6,369,386 | B1 * | 4/2002 | Charlier | G01J 5/10 250/252.1 |
| 6,549,392 | B1 * | 4/2003 | Ohno | H01L 21/6831 361/234 |
| 7,993,057 | B2 | 8/2011 | Aggarwal et al. | |
| 2002/0084261 | A1 * | 7/2002 | Yamazaki | H01L 21/67109 219/390 |
| 2002/0179838 | A1 * | 12/2002 | Porter | H04N 5/361 250/338.3 |
| 2010/0173495 | A1 * | 7/2010 | Thakur | H01L 21/67115 438/785 |
| 2012/0180856 | A1 * | 7/2012 | Sargent | H01L 51/441 136/255 |
| 2019/0006218 | A1 | 1/2019 | Toyoda et al. | |
| 2021/0272827 | A1 * | 9/2021 | Nakajima | H01L 22/12 |

FOREIGN PATENT DOCUMENTS

| | | |
|---|---|---|
| KR | 10-1930011 B1 | 12/2018 |
| TW | 489397 B | 6/2002 |
| TW | 523845 B | 3/2003 |
| TW | I302358 B | 10/2008 |
| TW | I381452 B | 1/2013 |
| TW | I434031 B | 4/2014 |
| TW | I500096 B | 9/2015 |
| TW | I649821 B | 2/2019 |

* cited by examiner

METHOD AND APPARATUS FOR CALIBRATION OF SUBSTRATE TEMPERATURE USING PYROMETER

RELATED APPLICATIONS

This application claims priority to U.S. Provisional patent application No. 62/855,465, entitled METHOD FOR CALIBRATION OF SUBSTRATE TEMPERATURE USING PYROMETER, filed May 31, 2019, and incorporated by reference herein in its entirety.

FIELD OF THE INVENTION

The present embodiments relate to substrate processing at elevated temperatures, and more particularly to accurate substrate temperature measurement and control.

BACKGROUND

Processing of substrates at high temperatures often entails preheating of a substrate before processing. As an example, a substrate may be preheated in a first chamber, a preheat chamber or station, of a process tool, and subsequently transferred to a second chamber (a process chamber) or station, for performing a given operation, such as ion implantation, chemical vapor deposition (CVD), physical vapor deposition (PVD), substrate etching, or other suitable process.

Often, heating of a substrate in a preheat chamber (or preheat station) involves different heating apparatus than heating in the process chamber. For example, a process chamber may employ resistive heating or similar heating, where a platen is heated and heat is transferred to the substrate through a combination of conduction, convection, and/or radiation. A preheat chamber may be heated by heat lamps or other non-contact method.

Likewise, substrate temperature measurement may be performed by different techniques in different chambers. For example, substrate temperature measurement may be performed by a contact approach, such as using a thermocouple (TC) to directly measure heat (TC contact approach) conducted from the substrate or platen to the thermocouple. This TC contact approach requires good thermal conductivity between the surface of a substrate or wafer and the TC. In a high vacuum environment, microscopic gaps between the surface of the TC and the wafer can significantly reduce this conductivity. This reduction can result in a large offset between the TC temperature and the wafer surface temperature during contact. The offset between the TC and wafer temperature can vary according to the contact pressure, which variation, in turn, can necessitate a more complex system to control the TC contact force.

The thermal conduction offset may be reduced by flowing gas (e.g., $N_2$) between the TC and wafer surface. Notably, this use of flowing gas increases system complexity and cost by introducing a system to deliver and control the gas flow.

Additionally, unexpected variations in this TC contact offset may occur when a user changes the thickness or material coating the backside of process wafers. These coatings may be customer-specific, and may not be disclosed to a tool (process equipment) manufacturer responsible for setting substrate temperature controls. Consequently, the manufacturer may have difficulty in helping the customer resolve temperature offsets related to changes in a backside coating on a substrate.

Moreover, in a process tool including a preheat chamber or station, process protocol may call for heating the substrate to a temperature close to the desired or target substrate for processing the substrate, which temperature may be referred to herein as a "process temperature." Meanwhile the substrate temperature of a substrate holder or platen in the process chamber may be set to the process temperature in the process chamber, using measurement tools, such as a thermocouple to establish the process temperature. Notably, the actual substrate temperature may change while the substrate is transferred between a preheat chamber and a process chamber. Additionally, using contact approaches to measure substrate temperature in a preheat stage may introduce unwanted damage, such as scratches, to a substrate. For example, mechanically pressing a TC into a wafer usually requires an additional motor and mechanism which apparatus can increase the cost and complexity of the preheat station. In addition, the operation of pressing a TC into the wafer surface during calibration may cause microscopic scratching of the wafer surface which damage can result in particles contaminating process wafers after calibration.

Additionally, tradeoffs in the results depending upon the mass of the TC itself may also need to be taken into consideration. A heavier TC will result in more stable, accurate temperature, but usually results in a slower response, which response can reduce the overall throughput of the machine. A lighter TC has a faster temperature response but may have a noisier and less stable signal.

With respect to these and other considerations, the present disclosure is provided.

BRIEF SUMMARY

In one embodiment, a method may include heating a substrate on a platen in a first chamber, where the platen is characterized by a platen temperature. The method may include measuring the platen temperature in the first chamber using a contact temperature measurement; transferring the substrate to a second chamber after the heating; and measuring a voltage decay after transferring the substrate to the second chamber, using an optical pyrometer to measure pyrometer voltage as a function of time.

In another embodiment a method may include sending a heat signal to heat a substrate platen in a process chamber to a platen temperature, measuring the platen temperature by a contact temperature measurement, and sending a first transfer signal to transfer the substrate to the substrate platen in the process chamber, when the substrate platen is at the platen temperature. The method may include, after a temperature-stabilization interval, at a transfer instance, sending a second transfer signal to transfer the substrate from the process chamber and place the substrate in a substrate position in a preheat station. The method may also include receiving a plurality of voltage readings as a function of time from an optical pyrometer, the optical pyrometer measuring the substrate when the substrate is placed in the substrate position, and generating a voltage decay curve comprising the plurality of readings, for a predetermined time interval.

In a further embodiment, a non-transitory computer-readable storage medium storing computer-readable program code executable by a processor is provided to send a heat signal to heat a substrate platen in a process chamber to a process temperature. The computer-readable program code may be executable by the processor to send a record signal to record the platen temperature by a contact temperature measurement, and send a first transfer signal to transfer a substrate to the substrate platen in the process chamber, when the substrate platen is at the platen temperature. The computer-readable program code may be executable by the processor to, after a temperature-stabilization interval, at a transfer instance, send a second transfer signal to transfer the substrate from the process chamber and place the substrate in a substrate position in a preheat station. The computer-readable program code may be executable by the processor to receive a plurality of voltage readings as a function of time from an optical pyrometer, the optical pyrometer measuring the substrate when the substrate is placed in the substrate position, and generate a voltage decay curve comprising the plurality of readings, for a predetermined time interval.

DETAILED DESCRIPTION OF THE PREFERRED EMBODIMENTS

In the present embodiments, a pyrometer may be employed instead of a contact measurement, such as a TC, to measure wafer temperature during a preheat stage. The use of a non-contact technique, such as optical pyrometer (or just "pyrometer") to measure substrate may avoid issues such as scratching a substrate, and other issues noted above. While the use of a non-contact approach to measure substrate temperature in a preheat chamber at the same time as using a contact approach to measure substrate temperature in a process chamber may in principle introduce measurement uncertainties, the embodiments disclosed herein provide novel approaches to calibrate a pyrometer to temperature, to avoid the aforementioned issues.

According to the present embodiments, in order to calibrate the output of a pyrometer in the first place, a TC contacting the substrate or wafer directly or indirectly is firstly used. This approach is novel, since the use of a TC in the preheat station is avoided and instead, the indirect temperature measurement of embedded TCs in a platen at a remote process station is used to deliver the wafer at known temperatures to the preheat station during pyrometer calibration. In usual configurations, a remote process platen may already be equipped with a system to deliver an inert gas such as $N_2$ between the platen surface and the wafer for improved thermal conduction, so the embedded TCs would provide a better estimation of the actual wafer temperature. Thus, the present embodiments may leverage pre-existing hardware in a process chamber platen to provide a substrate to a preheat chamber, where the substrate temperature is well known at the time of delivery to the preheat station, by virtue of the hardware present in the process chamber, obviating the need for the TC in the preheat station.

In brief, before a pyrometer is used to measure wafer temperature, the output of the pyrometer is calibrated using a wafer, heated over a range of known temperatures. In one possible approach, not employed by the present embodiments, a calibration of the pyrometer would require the preheat station to be equipped with a pyrometer, and also have a means to connect a TC to a wafer at different temperatures, so the pyrometer output (e.g., 0V-10V) and the TC temperature are measured simultaneously.

Ideally, an accurate way to measure the wafer temperature during pyrometer calibration is to use a TC test wafer having a TC embedded or attached permanently to the wafer surface. Notably, there are several disadvantages to using a TC test wafer for pyrometer calibration: A) because process wafers for a given set of wafers may proprietary to a customer, for every set of wafers to be processed constituting a different wafer type with a different emissivity, the customer would need to provide a separate TC test wafer. This approach may be unduly time consuming and expensive. B) A wireless version of a TC test wafer is bulky and may not fit through narrow openings between wafer stations in a wafer handling chamber. C) A wired version of the TC test wafer has an attached harness restricting the travel of the wafer in the handling chamber. D) both the bulky wireless version and wired version may require the substrate processing tool be vented to put the TC test wafer in place before the wafer can be placed back into high vacuum before calibration. Venting a substrate processing tool, such as a semiconductor tool, is undesirable since venting results in a long period of machine downtime from the vent and "rehivac," and the procedure to clean up particles stirred up during the vacuum cycle. E) An alternative approach is to press a TC into the wafer during the pyrometer calibration. This approach avoids the vacuum cycle downtime and wafer motion restrictions of the TC embedded test wafer approach and can be used to calibrate each customer wafer type having a different emissivity. However, there are disadvantages to this approach as well. These disadvantages include the aforementioned issues discussed above, including disadvantages of the conventional wafer temperature measurement technique using TCs.

In various embodiments of the disclosure, a Pyrometer Temp Decay Calibration (PTDC) method is presented to calibrate a preheat station pyrometer without a TC test wafer or temperature probe in the preheat station. Wafers processed in substrate processing tools at high temperatures (e.g., 200° C.-800° C.) may be preheated at a preheat station before delivery to a process platen in a process chamber or process station. For process repeatability, the substrate temperature may need to be measured during the preheating stage. The embodiments to follow detail approaches to calibrate a preheat station pyrometer to a process wafer, such as a proprietary process wafer having an unknown thermal emissivity, without the need for attaching or pressing a TC (Thermocouple) into the wafer during calibration. Because these approaches are non-invasive, the approaches may be repeated during full substrate production runs to periodically verify system calibration.

In overview, the present embodiments employing a PTDC method measure the signal decay response of a pyrometer focused on a wafer (the term "wafer" as used herein may be used to mean "substrate" in general, unless indicated differently). The signal decay is measured when the wafer is situated in a local preheat station while cooling down after being removed from a remote station or process chamber, where the wafer had been previously heated by a known means and the initial temperature was measured by a known method. As an example, the wafer may be initially heated to a measured wafer temperature in an implant station of an ion implanter, or alternatively in a dedicated wafer heating chamber, where either of these locations may be deemed a process chamber. In the present embodiments, a measurement or calibration system may fit a curve to this pyrometer cooldown decay response (Volts), and may extrapolate to a voltage level representing the voltage value the pyrometer would have been reading if the pyrometer was pointing directly at the wafer when situated in the implant station or process chamber at the stable temperature before removal. This extrapolation provides the preheat station with a Pyrometer (Volts)-to-Wafer Temperature (° C.) calibration point. The result will be a single calibration point (V to ° C.) for each known starting temperature and subsequent decay-response, within a given calibration curve cycle. Advantageously, after a sufficient number of calibration points are gathered over a desired temperature range (e.g., 350° C.-600° C.), and a trendline between the points is computed, a processing system is able to determine the wafer temperature from the pyrometer reading in a preheat station.

Notably, the infrared emissivity of the particular type of wafer used during a calibration may change the cooldown decay response curve. For example, a high emissivity wafer (carbon) will cooldown much faster than a standard silicon wafer having lower emissivity. As a result, the carbon wafer cooldown's decay response will be faster than the decay response for the silicon wafer. In view of the above, and according to embodiments of the disclosure, each wafer type having significantly different infrared emissivity may be subjected to a calibration procedure to generate a specific calibration curve for that wafer type having that infrared emissivity. Accordingly, in various embodiments, a system may include non-transitory computer readable storage medium (media) to store the pyrometer calibration data (such as a pyrometer calibration curve) for that particular wafer type, so a processing tool may switch to use the specific pyrometer calibration curve when that particular wafer type arrives at the preheat station before processing.

In various embodiments, after loading the stored calibration curve for a particular type of wafer, a processing system is able to preheat the wafer to a repeatable temperature using a given pyrometer reading. This preheat temperature may be controlled for optimal throughput and process results. Also, since this method is non-invasive and can work on actual process wafers, this cooldown decay response can be measured periodically during full production to ensure the calibration is within process control limits. In accordance with some embodiments of the disclosure, this periodic "health check" may stop the system and alert the operator if there is a problem with the pyrometer electronics, wiring, optical alignment etc. Also, in one embodiment, this health check may be used on the first wafer of each cassette to make sure the wafer type assigned to the wafers has the correct temperature response when the corresponding calibration curve is activated.

The following figures and flow charts show examples of a Pyrometer Temp Decay Calibration (PTDC) method for a pyrometer situated in the preheat chamber of a processing tool, such as an ion implanter designed to process the wafer at a remote implant station. The calibration operation of the present embodiments cycle the wafer "backwards" by starting at the known, stable substrate temperature on the process platen in a process chamber, before delivering to the preheat station (at a stable, warm temperature) for the resulting cooldown decay response. In brief, the present embodiments ma be employed to facilitate accurate heating of a process substrate (production substrate) in a chamber such as a preheat chamber to a targeted temperature, using an experimental substrate temperature of the substrate recorded by an optical pyrometer. In turn, the experimental substrate temperature is determined by outputting an experimental voltage, generated in the optical pyrometer by emission from the process substrate, and mapping the experimental voltage to a corresponding substrate temperature on a calibration curve. The creation of such calibration curves is detailed in the embodiments to follow.

Figure 1:
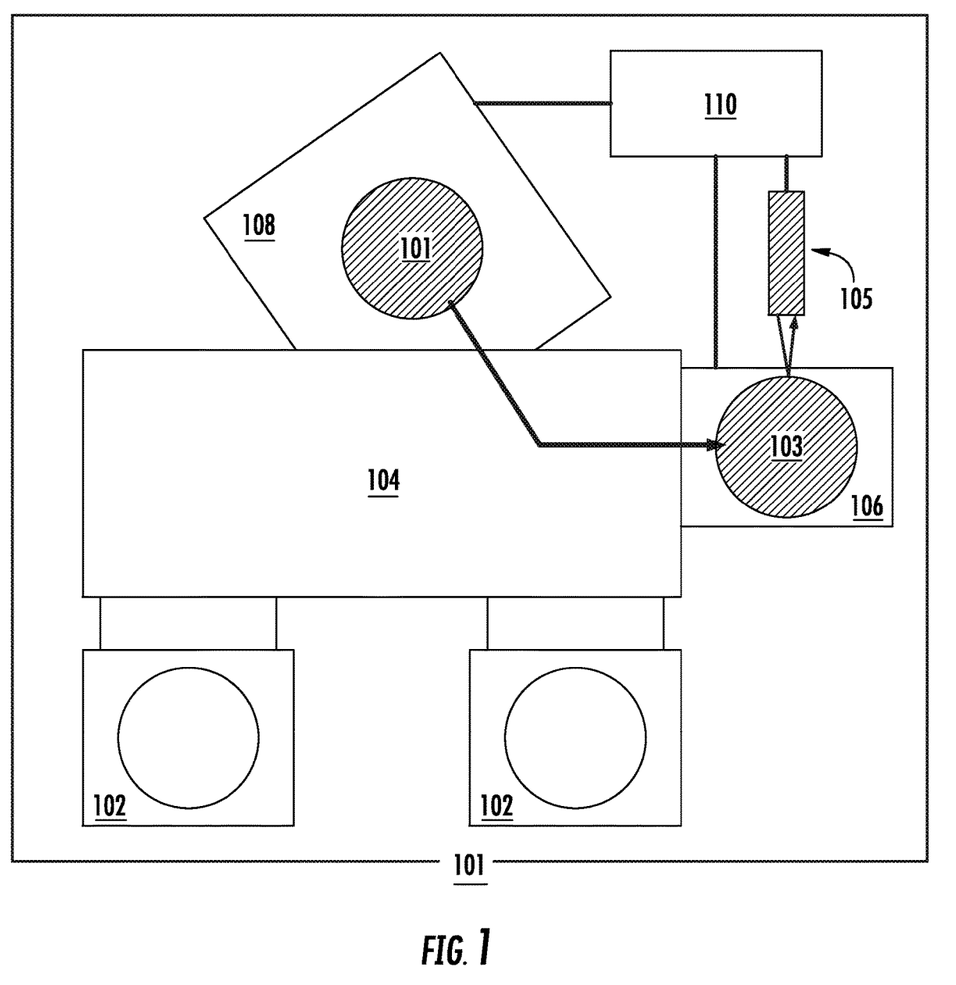
FIGS. 1-3 together illustrate a Pyrometer Temp Decay Calibration (PTDC) method according to embodiments of the disclosure.
Figure 2:
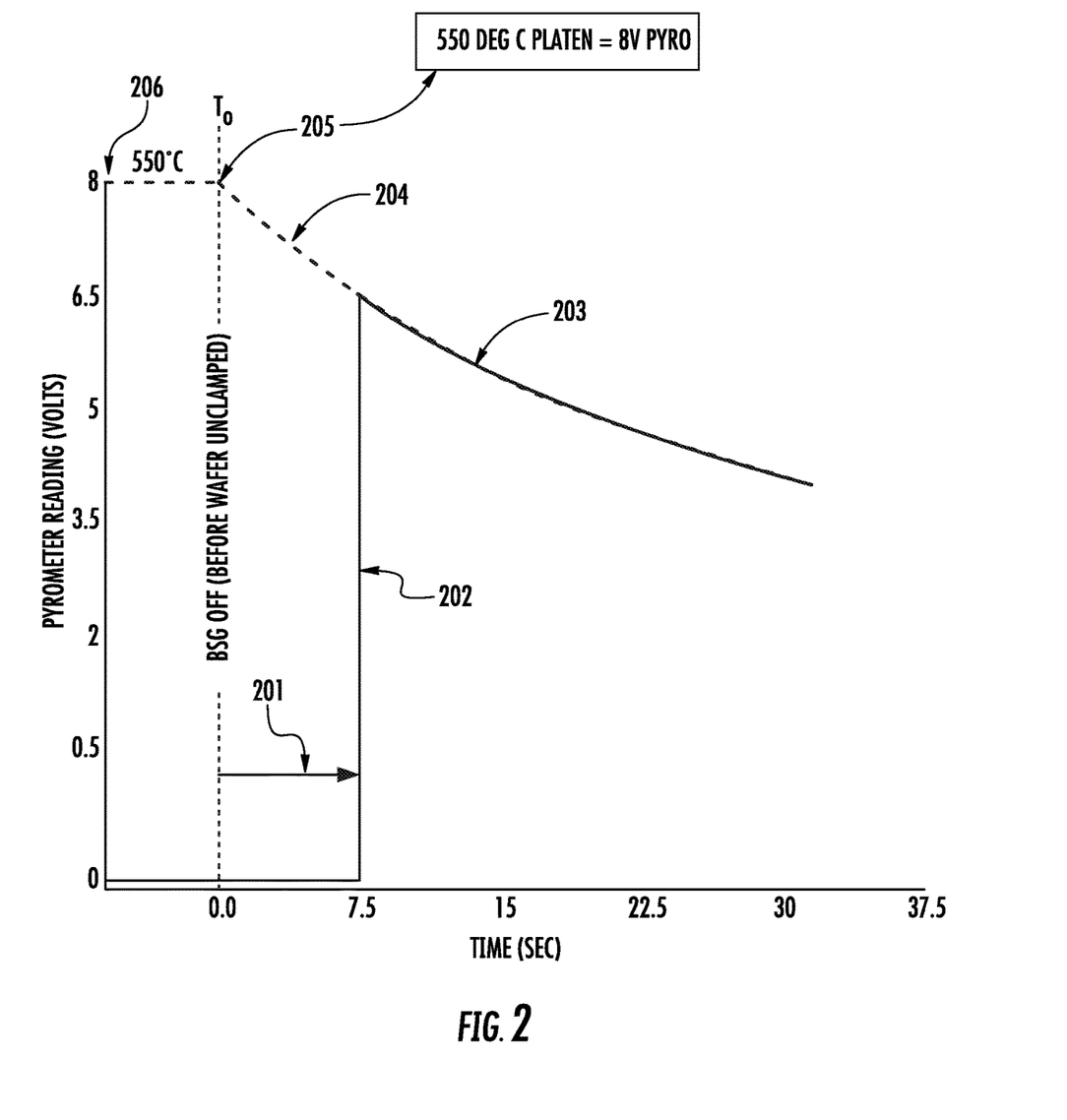
Figure 3:
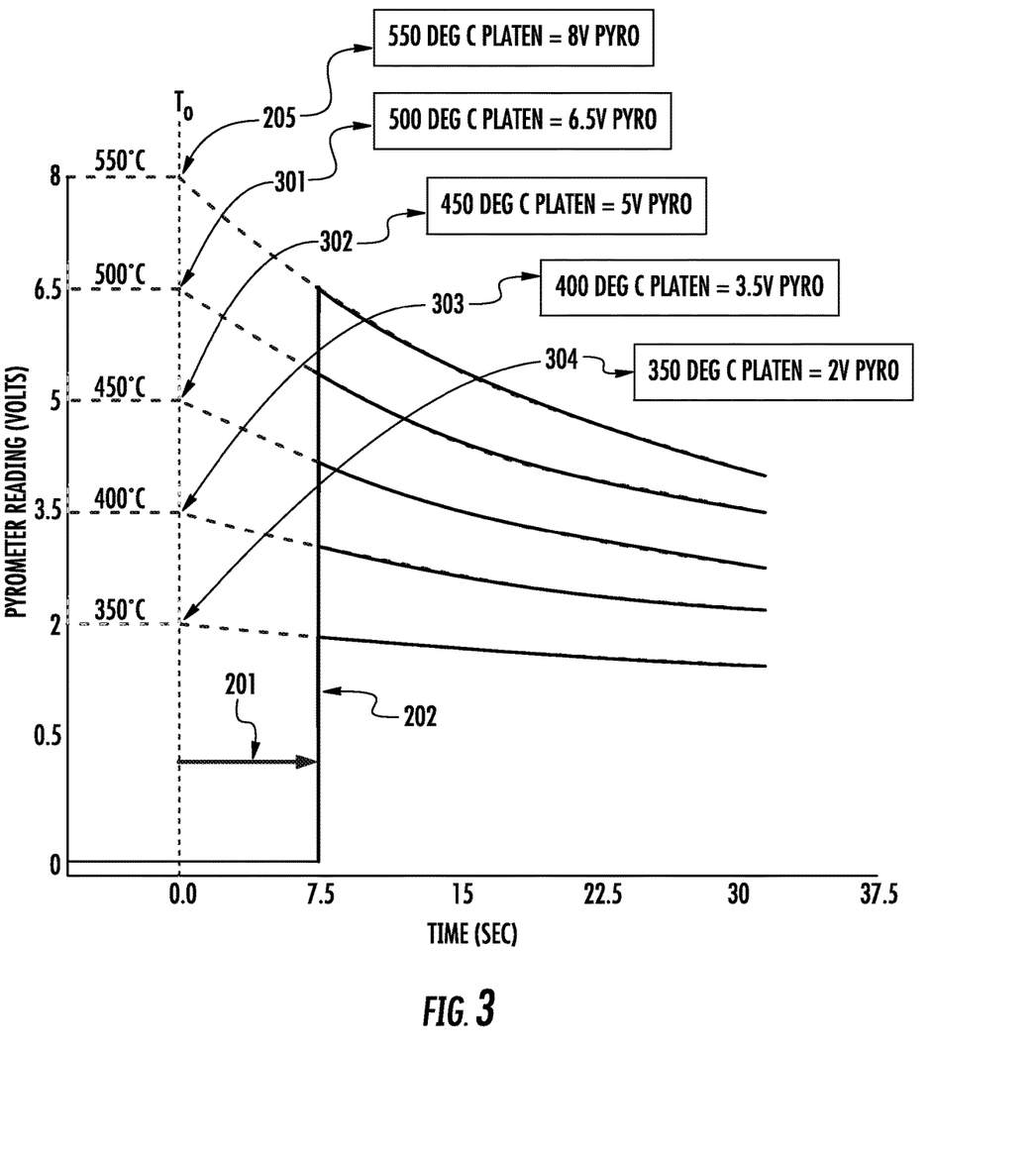

FIGS. 1-3 together illustrate a Pyrometer Temp Decay Calibration (PTDC) method according to embodiments of the disclosure. In particular, the PTDC method is used to obtain a pyrometer calibration point (Volts) for 550° C. In FIG. 1, a processing system, shown as system 100, is shown, including loadlocks 102, a transfer chamber 104, a preheat station 106, and process chamber or a process station 108. According to some embodiments, detailed further below, one or more operations of the PTDC method may be controlled by a control system or controller 110.

In a first operation (stage 1) a wafer (not separately shown) is placed on a remote heating station, such as on a substrate platen, shown as a process platen 101, in a process chamber, such as process station 108, where the substrate platen has been heated up to 550° C. The heating of the wafer and measurement of wafer temperature in the remote heating station may be performed according to known techniques, such as resistive or inductive heating of a platen, and measurement using a contact temperature measurement, such as a TC. The heating and temperature measurement may also be accomplished with a TC embedded in a platen while backside gas is applied between the platen surface and the wafer. As such, depending upon the exact apparatus and conditions in the remote heating station, the wafer has reached an equilibrium temperature such as approximately 10° C.-50° C. below the process platen temperature. Notably, this wafer temperature offset of 10-50° C. may depend primarily upon the infrared radiation using the Stefan-Boltzmann law. Other factors affecting this offset between the starting platen temperature and the wafer temperature include backside gas pressure present on the wafer, clamping force of the wafer to the substrate platen, and wafer type emissivity. For the purposes of simplicity of illustration, and in accordance with some embodiments this offset may be assumed to be zero. In accordance with other embodiments (described later), an additional operation may be performed to take this offset into account to improve overall calibration accuracy.

After temperature stabilization of the wafer at approximately 550° C., this 550° C. wafer (assuming no offset) is moved as quickly as possible to the preheat station 106 and placed in a wafer position 103, to obtain the initial pyrometer reading and subsequent cooldown decay response. The elapsed time, or transfer interval, between when the temperature-stabilized wafer at 550° C. is located on the process platen 101, and placement and initial measurement of a wafer at the preheat station 106 may be approximately 7.5 seconds. However, the embodiments are not limited in this context, while the transfer time may be a fewer number of seconds or more seconds.

In various embodiments before the placing the substrate in a preheat station, prewarming of the preheat station may take place to a targeted prewarm temperature, where this targeted prewarm temperature may be set in a range of temperatures. For example, for each calibration point measurement, heating lamps in the preheat station may be set to a "keep-warm" value, so the surrounding walls are thermally stable at a temperature between 50° C.-150° C. In other embodiments, the preheat station may be placed at room temperature, or may be heated above 150° C. This heating of the surrounding walls ensures the background infrared radiation effect on the pyrometer reading is not significantly different for each calibration point. In other embodiments, a preheat station may be kept at a "cold" room temperature during calibration in order to reduce the background infrared radiation during calibration, where the background radiation might otherwise add an unwanted artifacts to the pyrometer reading.

During this wafer transfer interval (e.g., 7.5 Sec), a pyrometer 105 may be focused on the wafer position 103 of the preheat station 106, while notably there is no reading (for example, the pyrometer may read close to zero volts) on the pyrometer 105 yet, since the wafer has not yet arrived at the preheat station 106. Because of this gap in the pyrometer reading, the cooldown decay curve is later extrapolated (described below) to zero time to obtain the calibration point, where the zero time represents a transfer instance when transfer commences of the heated substrate, from the process platen 101, to the preheat station 106.

As soon as the wafer is transferred into the preheat station 106, the pyrometer 105, already powered on and operational, starts to read the wafer temperature, as represented by a sharp increase in voltage. In particular, the pyrometer signal voltage for the pyrometer 105 jumps up to an initial value, as shown by a vertical or steep portion of curve 202 (solid lines) in FIG. 2.

The temperature decay response of the wafer is then measured by the pyrometer. In other words, as the wafer remains in the preheat station 106, the wafer will naturally cooldown from an initial temperature when just placed in the preheat station 106 (represented by time=7.5 seconds (line 201 in FIG. 2). In some embodiments, the wafer is subsequently maintained in the preheat station 106 for 30 sec-several minutes so the temperature decay response (see curve 203) in the pyrometer can be recorded. As shown, the curve 203 actually is a voltage decay response, representing the decay in pyrometer voltage with time as the wafer temperature decreases.

In accordance with some embodiments, curve fitting is applied, such as a least squares, polynomial curve fit being applied to the pyrometer voltage decay signal (curve 203) so the curve 203 can be extrapolated (curve 204) over the transfer interval 0-7.5 Sec (line 201) (where there was no pyrometer reading), back to the transfer instance at time=0 (point 205), as shown by curve 204 (dashed line).

A result is the generation of the curve 204 (dashed line), where the extrapolated pyrometer voltage value at T=0 sec (point 205), corresponding to the wafer transfer instance, is determined by extending a horizontal line (206) to the Y-axis from the intersection of a vertical line at T=0 sec with the curve 204.

In some embodiments, at the transfer instance corresponding to T=0 sec (point 205), backside gas (BSG) provided to a substrate in process station 108 is turned off, followed by unclamping of the substrate from the substrate holder (this time is when the wafer starts to cool down). As illustrated in the example of FIG. 2, this series of operations may result in the generation of a pyrometer calibration data point, such that the pyrometer reading of the wafer would be approximately 8 volts if measured when the wafer was situated on the process platen 101 in process station 108 at 550° C.

Notably, the measuring of platen temperature in a process chamber, the transferring the substrate to a preheat chamber after heating, and the measuring of voltage decay after transferring the substrate may be deemed to constitute a calibration cycle. Moreover, the combination of curve fitting, such as fitting of the polynomial function, the extrapolating a voltage decay curve to zero time, and the determining the zero-time pyrometer voltage may be deemed to constitute a calibration curve cycle. As detailed below, the cycles may be repeated to generate trendlines useful for determining substrate temperature of a given substrate based on a given pyrometer reading.

FIG. 3 shows how this same method is used obtain more calibration points at different substrate temperatures. For example: the pyrometer decay curve is calculated for a wafer having started on a process platen in a process station at a process temperature (meaning the accurately measured process platen temperature) of 500° C., represented by the sequence of operations designated by 301. The pyrometer decay curve is calculated for a wafer having started on a process platen at 450° C., represented by the sequence of operations designated by 302. The pyrometer decay curve is calculated for a wafer having started on a process platen at 400° C., represented by the sequence of operations designated by 303. The pyrometer decay curve is calculated for a wafer having started on a process platen at 350° C., represented by the sequence of operations designated by 304. In each case, the underlying scenario involves transfer from the process platen at the given process temperature, where the transfer interval (line 201) takes 7.5 seconds. An initial jump in the pyrometer voltage reading (curve 202), characteristic of the given substrate temperature at 7.5 seconds after the transfer process is initiated, is followed by a decay in voltage vs time as the substrate cools down.

Figure 4:
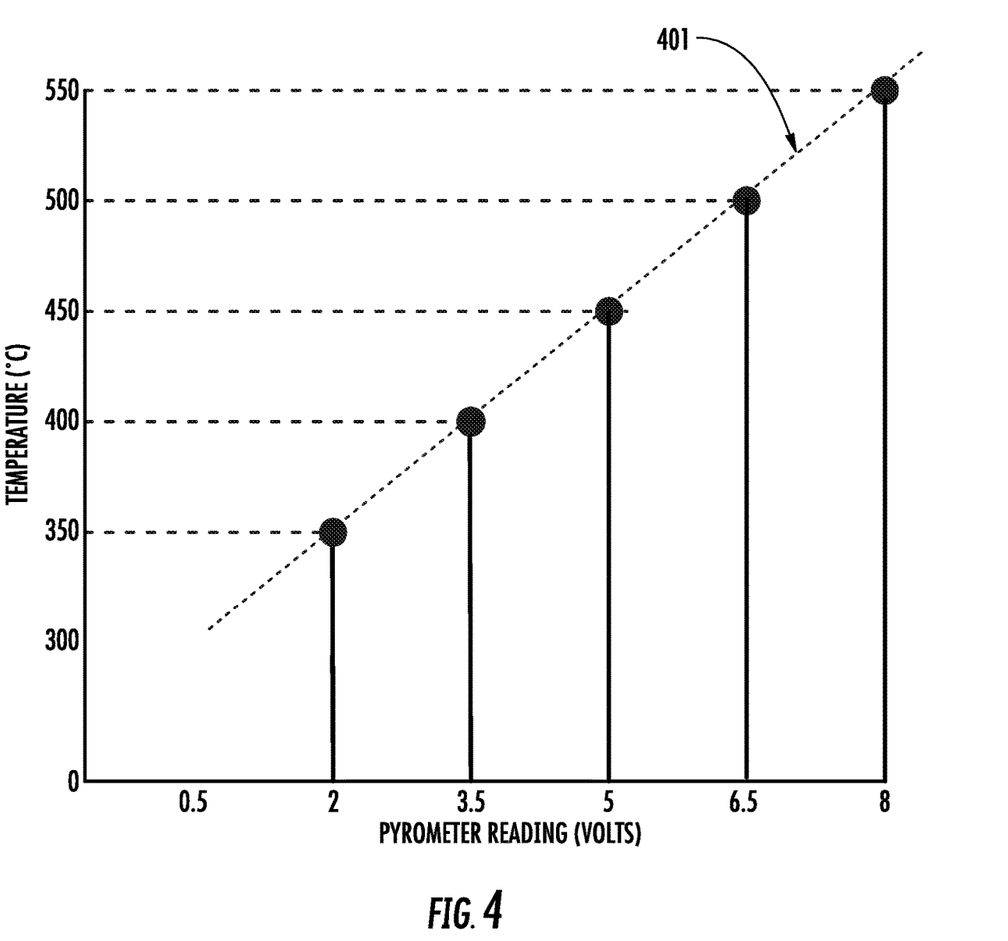
FIG. 4 presents a chart showing a simple trendline for Temperature vs Pyrometer Voltage based upon calibration points of FIG. 3.

FIG. 4 presents a chart showing a trendline 401 or calibration curve for substrate temperature vs pyrometer voltage based upon voltage-platen temperature data points, taken from the Y-axis intercepts corresponding to horizontal lines intercepting the pyrometer values at the T=0 seconds. In turn, the pyrometer voltage values at T=0 second represent the intersection of a vertical line at T=0 seconds with the extrapolated curves (dashed curved lines), extrapolated from each of the measured pyrometer voltage curves of FIG. 3, shown as solid lines. As illustrated in FIG. 4, a linear increase in pyrometer voltage takes place vs increased substrate temperature. Using a set of pyrometer voltage values as a function temperature, the system 100 may estimate the wafer temperature in the preheat station 106 based upon a given pyrometer voltage reading. This calibration routine may be repeated for each wafer type having a significantly different emissivity (temperature decay curve). Then, when the system 100 is about to process a new wafer type, the corresponding trendline, trendline 401 or calibration curve, corresponding to the new wafer type, may be loaded into the system 100, by the control system 110. The system 100 may then adjust an output and/or controls in the preheat station 106, so accurate control of substrate temperature or reading of substrate temperature, in the preheat station 106, is obtained, based upon real-time pyrometer voltage readings from the pyrometer 105.

Figure 5:
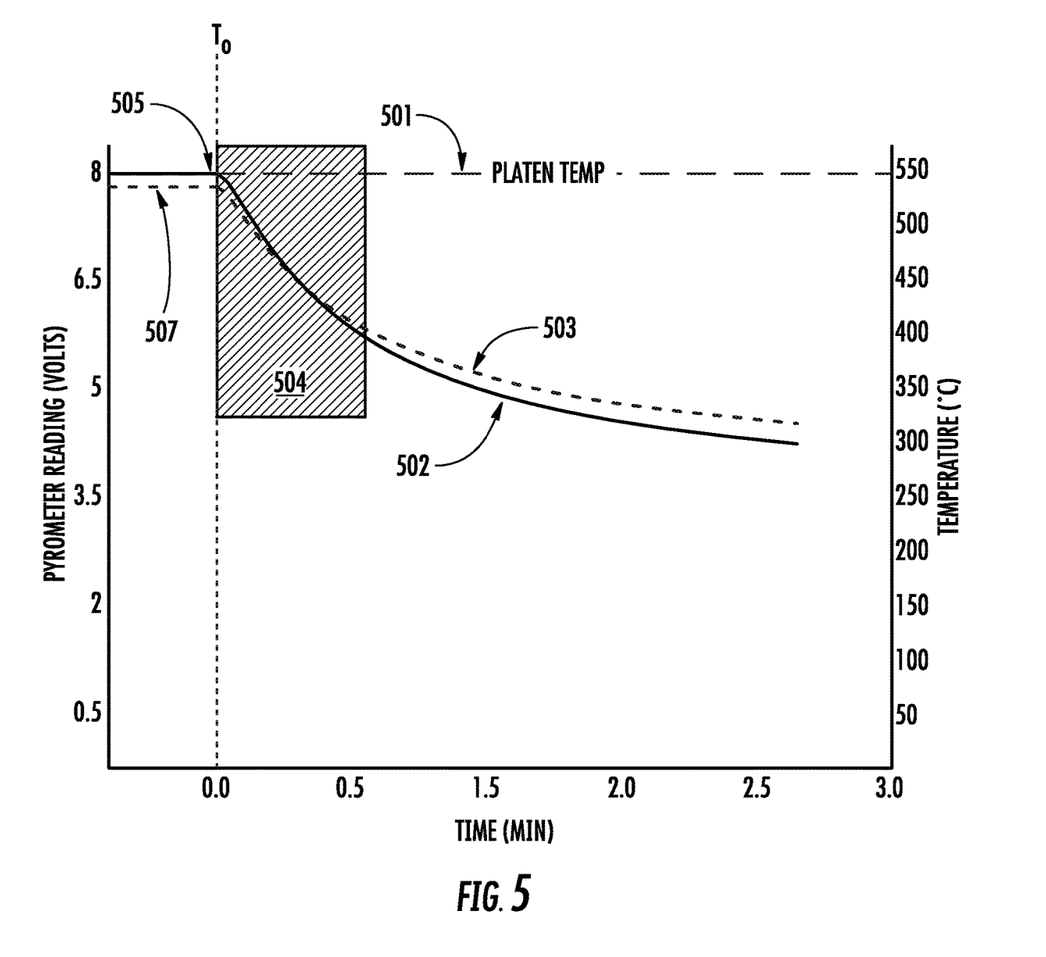
FIG. 5 is a graph presenting exemplary curves showing wafer temperature estimation taken from a pyrometer vs the actual temperature measured by a TC wafer.

FIG. 5 is a graph presenting exemplary curves showing wafer temperature estimation taken from a pyrometer vs the actual temperature measured by a TC wafer. The chart in FIG. 5 shows the wafer temperature estimation from the pyrometer vs. the actual temperature measured by a TC wafer. The pyrometer reading (solid curve 502) assumes the temperature of the wafer is the same as the platen temperature 501 when the wafer has reached equilibrium. This initial assumption of zero offset may be inaccurate. After equilibrium, the wafer temperature is generally less than the platen temperature by approximately 10° C.-50° C. The dashed line 507 shows the actual wafer temperature (TC wafer) in this example to be approximately 15 degrees less than the platen temp when the platen is at 500° C. Then, after the wafer is removed from the platen and cools down, the pyrometer reading (solid curve 502) will decay at a faster rate than the actual wafer temp (dashed line 503) because the wafer (silicon wafer) is becoming increasingly transparent to infrared (IR) radiation, responsible for generating pyrometer voltage, as the temperature decreases. The increasing transparency of the wafer to IR radiation during the cooldown causes the pyrometer to start "seeing-through" the wafer and picking up the background temperature of the preheat chamber. Since this background radiation is cooler than the wafer itself, the pyrometer calibration (solid line) thinks the wafer is cooler than the wafer actually is (dashed line).

However, as long as the two curves (voltage, ° C.) have a close fit in the first 30 seconds or so (represented by the grey box 504) of the cooldown interval, the calibration routine should have enough time to measure an accurate pyrometer voltage vs time trend suitable for extrapolation back to T=0 (point 505), to estimate a voltage corresponding to the platen temperature before the wafer starts cooling down.

Figure 6:
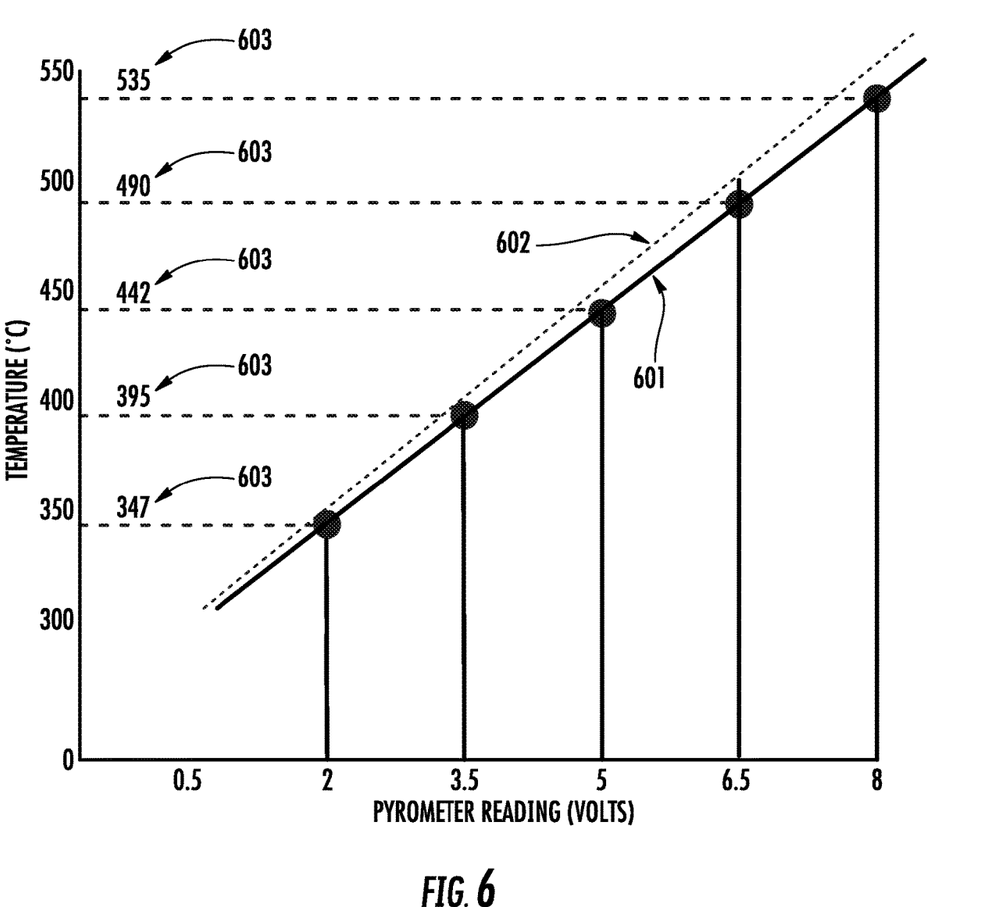
FIG. 6 illustrates exemplary voltage vs temperature curves showing a correction (solid line) trend line made to an initial calibration trend line (dashed line) assuming zero offset between the starting temperature of the wafer and the process platen.

FIG. 6 illustrates exemplary voltage vs temperature curves showing a correction (solid line) trend line 601 made to an initial calibration trend line 602 (dashed line), where the initial calibration line (dashed) assumes zero offset between the starting temperature of the wafer and the process platen. In FIG. 6, a correction (solid line) is made to the initial calibration trend line assuming zero offset between the starting temperature of the wafer and the process platen.

This offset can be calculated using equations from the Stephan-Boltzmann law for infrared radiation. The offset could also be empirically measured and characterized with a test wafer instrumented with a TC on an implant platen at different temperatures (0° C.-800° C.) and different backside gas pressures and clamp forces. This offset characterization for a standard pure silicon mechanical wafer may be repeated for wafers having different emissivity's if those wafer types show a significant difference offset under the same conditions. In various embodiments, this offset measurement would not be repeated in-situ under process conditions of an actual substrate being processed, since such an approach requires a special TC instrumented wafer. Therefore, an assumption underlying use of the offset procedure is this offset (for each condition) is relatively stable over time.

FIG. 6. also shows the corrected temperatures 603 after applying the offset trendline. These are the values for use for the voltage-to-temperature conversion of the pyrometer in the preheat station. Thus, the aforementioned approach resulting in FIG. 6 produces a calibration curve predicting the wafer temperature in the preheat station 106 based upon the pyrometer voltage reading. As shown in FIG. 6, for a given pyrometer voltage reading, e.g., 8 V, the substrate temperature predicted with correction is lower than without correction.

Said differently, when correcting for the offset, a pyrometer voltage of 8V will correspond to a lower substrate temperature (e.g., 535 deg ° C.) instead of the higher non-corrected substrate temperature of 550 deg ° C.

Notably, FIG. 6. shows the calibration trendline for one particular wafer type with a certain infrared emissivity. This same method may be repeated to obtain the calibration for each wafer type of significantly different emissivity a customer intends to use. In accordance with embodiments of the disclosure, this wafer type (or the calibration curve itself), may be entered into a recipe so the system 100 would know which calibration curve to apply before the pyrometer is used to predict the wafer temperature during preheating.

Notably, pyrometers are typically programmed to expect a particular wafer (target) infrared emissivity. A change in the pyrometer's emissivity program will switch the internal calibration of the pyrometer to a different output voltage range. In the methods of the present embodiments, the pyrometer expected emissivity program may be set to the same value for all wafer types, since the methods involve simply measuring the voltage decay of a pyrometer during the cooldown. This consideration implies a default emissivity program should be chosen for the pyrometer and not changed. For example, an emissivity of 0.7 for a typical unprocessed silicon mechanical wafer might be chosen as the default. By keeping the pyrometer emissivity program and constant, one less potential variable in process repeatability is removed.

As a result of the procedures highlighted by FIGS. 1-6, since a pyrometer calibration is known for each wafer type, during processing of actual production wafers, the wafer to be processed can be preheated to consistent temperature in a preheat station for improved process control. In additional embodiments, this calibration procedures as outlined above may also be repurposed to provide periodic health checks of the pyrometry system as well as a substrate process platen to detect various issues. In some non-limiting embodiments, these issues include: a) determining if a pyrometer is set at the wrong emissivity default; b) a pyrometer has an optical or mechanical mis-alignment; c) Increased debris or process film is obscuring a pyrometer window. The issues may also include: d) Wafers are identified as the wrong wafer type in the recipe being used to process the wafers; e) reduced substrate process platen backside gas (BSG) is present in the process station due to an obstruction in the BSG line; f) reduced process platen clamp force is present due to platen warp or electrostatic clamp degradation.

Figure 7:
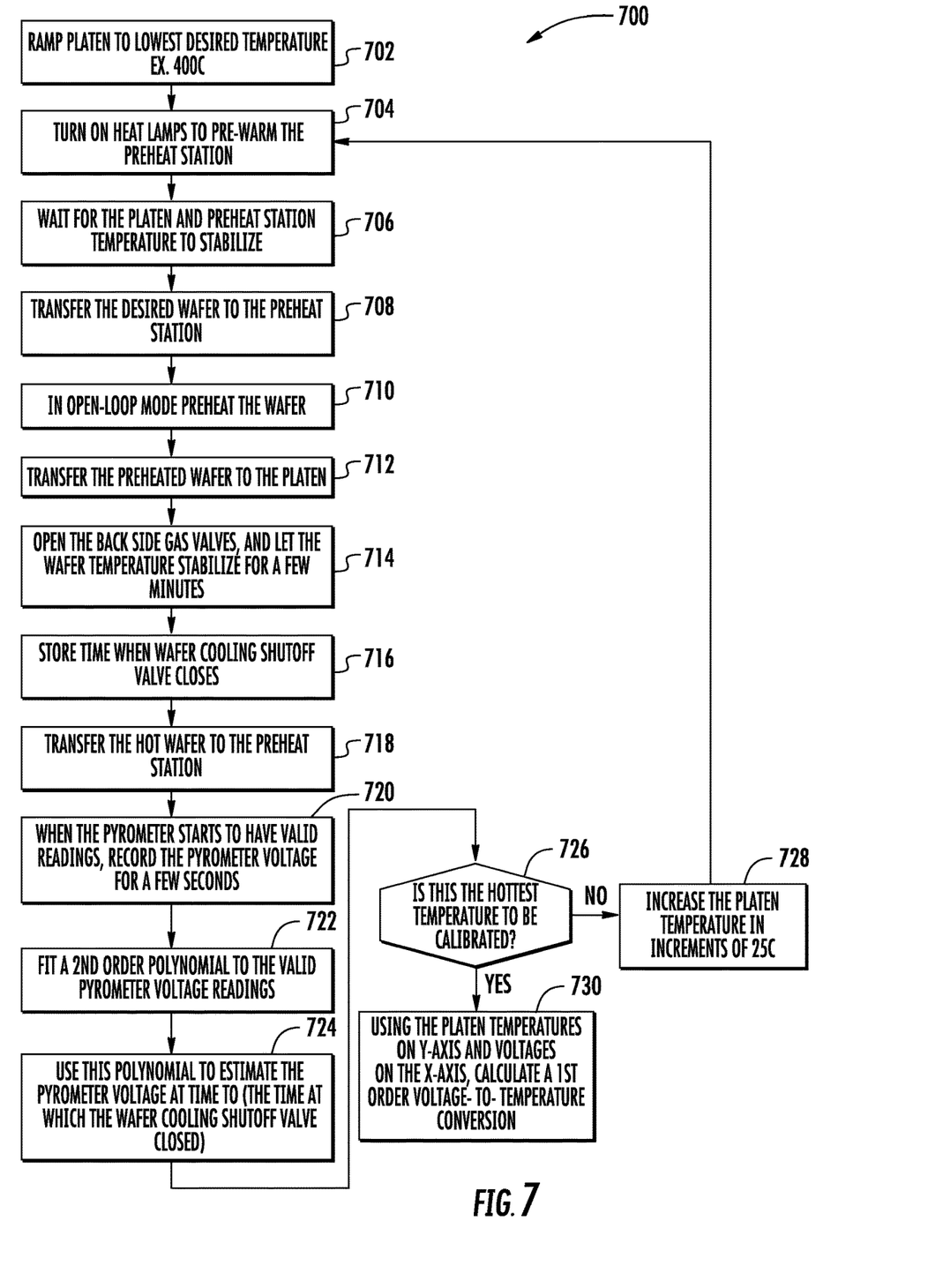
FIG. 7 presents a process flow in accordance with embodiments of the disclosure.

FIG. 7 presents a process flow 700, in accordance with embodiments of the disclosure, and in particular details the operations described above in a flow chart. The process flow 700 involves a series of operations, some of which operations may be repeated, as shown. At block 702 a process platen temperature is established, such as a lowest targeted process temperature, where calibration is desired. The process platen may be in a process chamber or process station of a processing tool, such as an implant station of an ion implanter, or any other process tool where substrates are to be heated. The temperature of the process platen may be ramped up to the lowest targeted temperature, for example.

At block 704, a preheat station for preheating wafers in prewarmed. As an example, heat lamps may be used to pre-warm components of a preheat station, such as inner walls, to temperatures in the range of 50° C. to 150° C. in non-limiting embodiments. In certain embodiments, the preheat station may also be at room temperature or maybe even hotter than 150 deg ° C.

In other embodiments, the inner walls of the preheat station may be kept close to room temperature during calibration.

At block 706, the process platen and preheat station may be held under constant conditions for a predetermined interval to allow the process platen temperature to stabilize at the targeted temperature, and to allow the preheat station temperature to stabilize at the preheat temperature.

At block 708, a given wafer is transferred to the preheat station. The given wafer may represent a particular wafer type to be used to calibrate production wafers of the same wafer type.

At block 710, the given wafer is preheated in the preheat station in an open-loop control mode. This open-loop control mode may be a simple time-based look up table to preheat the wafer with a certain lamp power and for a certain amount of time based upon the temperature of the process platen. When a semiconductor wafer is heated up, the semiconductor wafer will undergo a thermal expansion. If a room temperature wafer is loaded directly onto the process platen which platen is already at the high TO calibration temperature, all of the thermal expansion will occur on the process platen. This circumstance can cause particles from the backside of the wafer scraping the platen surface during thermal expansion while clamped to a process platen arranged to heat the wafer with direct contact. Therefore, to avoid particles from this thermal expansion scraping, the wafer can undergo most of its thermal expansion at a preheat station heating the wafer up with non-contact lamps. Because the pyrometer calibration has not been completed, the precise temperature of this preheated wafer is unknown. However, a general temperature-range of the wafer can be estimated based upon how long the wafer has been heating under lamps at a particular power. This open-loop control mode simply preheats the wafer with a lookup table arranged to deliver a certain amount of lamp power to the wafer for a certain amount of time based upon the process platen temperature. In summary, this procedure allows the wafer to undergo most of the thermal expansion with non-contact lamps before delivery of the wafer to the process platen to stabilize for an accurate TO temperature with direct thermal contact.

At block 712, the preheated wafer is transferred from the preheat station to the process platen in the process chamber. Notably, the process platen has the targeted temperature at the time the preheated wafer is transferred to the process platen.

At block 714, a temperature stabilization process is performed, which process may include providing backside gas to the substrate or substrate platen, where the stabilization process may require up to several minutes. The backside gas may accordingly provide improved thermal coupling between the wafer and the TCs embedded in the process platen.

At block 716 a wafer cooling shutoff valve is closed and the time (instance) when the shutoff valve closes is recorded or stored.

At block 718, the heated wafer is transferred from the process platen to the preheat station, such as being placed in a wafer position of the preheat station. The wafer position may correspond to the same position a process wafer is placed when being heated in the preheat station.

At block 720, pyrometer readings are recorded over a time interval where valid readings are first measured, for a duration of several seconds or more, such as up to 60 seconds in some non-limiting embodiments. The valid readings are recorded when the heated wafer comes into the field of view of the pyrometer, where the pyrometer is turned on and aimed at the wafer position before the heated wafer is transferred into the preheat station from the process station.

As such, the valid readings may be recorded as a plurality of readings sufficient to generate a curve representing pyrometer voltage as a function of time.

At block 722, a curve fitting process is applied to the set of valid pyrometer voltage readings. As an example, a second order polynomial may be fit the valid pyrometer readings. The polynomial may generate a curve representing voltage vs time for a desired temperature interval, for example.

At block 724, the polynomial is used to estimate pyrometer voltage at t=0. For example, the polynomial curve can be used to extrapolate the actual voltage vs time data back to t=0, so a pyrometer voltage reading when a wafer transfer process commences can be determined. The beginning instance of the wafer transfer process may correspond to the time when a wafer cooling shutoff valve is closed, in some embodiments.

At decision block 726 a determination is made as to whether the target temperature just applied for the process platen is the hottest process platen temperature to be calibrated. If so, the flow proceeds to block 730, where a graph or data structure providing a voltage-to-temperature conversion is calculated. The Y-axis may represent platen temperature, while the X-axis represents pyrometer voltage, for example.

If, at decision block 726, the current process platen temperature used to generate a corresponding pyrometer voltage does not represent the hottest process platen temperature to be calibrated, the flow proceeds to block 728, where the process platen temperature is increased. The process platen temperature may be increased in regular temperature increments in some embodiments, such as 50 degree increments, 25 degree increments, 10 degree increments, and so forth. For practical implementations, 25 degree increments may be sufficient.

The flow then proceeds back to block 704.

Figure 8:
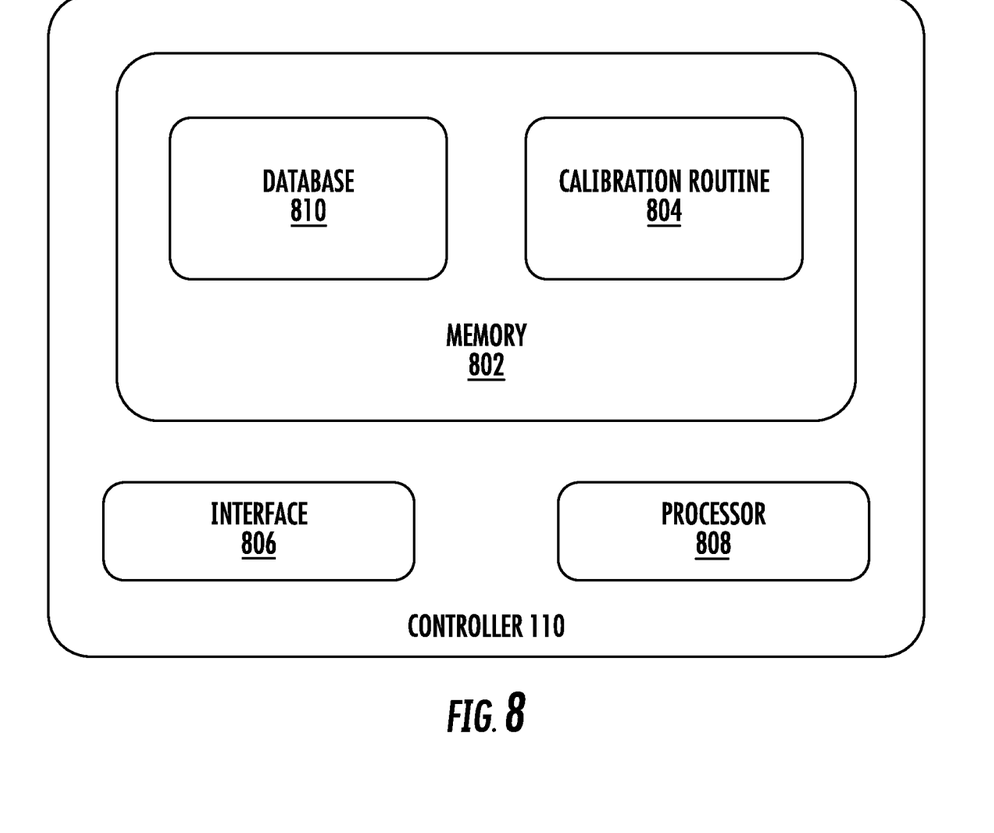
FIG. 8 depicts a controller in accordance with embodiments of the disclosure.

In various embodiments, at least some of the operations disclosed hereinabove may be automated. For example, the controller 110 may include various components to automate any combination of the aforementioned operations. FIG. 8 depicts a schematic of an implementation of the controller 110, according to various embodiments of the disclosure. The controller 110 may include a storage device, such as a memory 802. In some non-limiting embodiments, the controller 110 may be implemented in a computer, desktop computer, laptop computer, or other electronic device. The controller 110 may include an interface 806, to interface with various other components including process station 108, preheat station 106, and pyrometer 105. The controller 110 may include a processor 808, including circuitry to implement various operations as detailed below in conjunction with the memory 802. According to embodiments of the disclosure, the memory 802 may include components for implementing automatic control of the operations as outlined in FIG. 7. As an example, the memory 802 may include a calibration routine 804, for execution on the processor 808 to perform at least some of the operations of FIG. 7. For example, when a new substrate type is to be calibrated, the calibration routine may execute all or some of the operations as outlined in FIG. 7.

The memory 802 may also include a database 810, including a plurality of substrate type entries. A substrate type entry may identify the physical characteristics of the substrate, and may include a corresponding calibration curve determined for that substrate type, as detailed in the aforementioned embodiments. As such, an operator may employ the controller 110 to load in parameters to control heating of a production substrate, by entering the substrate type for the production substrate, thus prompting the controller to automatically retrieve the appropriate calibration curve for mapping recorded pyrometer voltage in a preheat station to substrate temperature. The preheating of the substrate may then be performed to generate an accurate substrate temperature based upon the recorded pyrometer voltage, before loading into a process platen in a process station.

In sum, the present approaches provide the advantage of a non-contact pyrometer to measure the wafer temperature in a semiconductor tool preheat station without requiring wafer-contacting thermocouples to calibrate the pyrometer before production. Semiconductor processing equipment arranged to heat wafers up to extreme temperatures before processing need to measure their temperature in a reliable manner during the initial heat up from room temperature. A particular advantage provided by the present embodiments the result of a reliable wafer temperature measurement during preheating stage, allowing a customer to specify a consistent preheat temperature for optimum throughput and process results. Another advantage provided in the present embodiments is the ability to readily determine substrate temperature without contact. Because the pyrometer calibration is performed in a non-contact manner, and does not require any TCs to touch the process wafer, the generation of backside particles and damage to a wafer are not a concern. Furthermore, since the present embodiments do not require a TC instrumented wafer or TC contact, the same approaches as disclosed herein provide the ability to check the calibration or perform a system health check with minimal interruption to full production. A further advantage is the present embodiments can be deployed to detect when the wrong wafer emissivity type was assigned to a particular lot of wafers before processing.

The foregoing description is provided to illustrate and explain the present embodiments. However, the description hereinabove should not be considered to limit the scope of the embodiments set forth in the claims appended here to.

What is claimed is:

1. A method, comprising:
heating a substrate on a process platen in a first chamber, the process platen characterized by a platen temperature;
measuring the platen temperature in the first chamber using a contact temperature measurement;
transferring the substrate to a second chamber after the heating;
recording a zero time, the zero time corresponding to an instance when the transferring the substrate commences; and
measuring a temperature decay response after the zero time during a measurement interval, using an optical pyrometer, the measuring the temperature decay response comprising:
measuring a pyrometer voltage that is output by the optical pyrometer at a plurality of instances to generate a plurality of voltage data;
generating a voltage decay curve from the plurality of voltage data; and
extrapolating the voltage decay curve from the measurement interval to the zero time.

2. The method of claim 1, the measuring the temperature decay response curve comprising fitting a polynomial function to the plurality of voltage data.

3. The method of claim 1, the transferring comprising placing the substrate at a substrate position in the second chamber at a second instance, subsequent to the transfer instance, the method further comprising:
determining a zero-time pyrometer voltage by determining a pyrometer voltage corresponding to an intersection of the voltage decay curve at zero time with a horizontal line; and
mapping the zero-time pyrometer voltage to the platen temperature to generate a voltage-platen temperature data point.

4. The method of claim 1, wherein the second chamber comprises a preheat station, the method further comprising:
placing the substrate in the preheat station before the heating the substrate in the first chamber; and
before the placing the substrate, prewarming the preheat station to a targeted prewarm temperature.

5. The method of claim 1, wherein the heating the substrate in the first chamber, the
measuring the platen temperature in the first chamber, the transferring the substrate to a second chamber after the heating, and the measuring the voltage decay after transferring the substrate, comprising a first calibration cycle, the method further comprising:
performing at least one additional calibration cycle, wherein the platen temperature is increased between the first calibration cycle and the at least one additional calibration cycle.

6. The method of claim 5, wherein the generating the voltage decay curve, the extrapolating the voltage decay curve to the zero time, and the determining the zero-time pyrometer voltage comprise a first calibration curve cycle, the method further comprising:
performing at least one additional calibration curve cycle, wherein the platen temperature is increased between the first calibration curve cycle and the at least one additional calibration curve cycle, wherein each calibration cycle of the first calibration cycle and the at least one additional calibration cycle generates a voltage-platen temperature data point; and
generating a calibration trend line comprising a plurality of voltage-platen temperature data points, based upon the first calibration cycle and at least one additional calibration cycle.

7. The method of claim 6, further comprising:
recording a first substrate type for the substrate;
loading a process substrate into the second chamber;
heating the process substrate in the second chamber to a targeted temperature, using an experimental substrate temperature of the substrate recorded by an optical pyrometer, wherein the experimental substrate temperature is determined by:
outputting an experimental voltage, generated in the pyrometer by emission from the process substrate; and
mapping the experimental voltage to a corresponding substrate temperature on the calibration curve.

8. The method of claim 6, further comprising:
determining, for a targeted temperature range, an offset between platen temperature and substrate temperature, when the substrate is disposed on the platen; and
generating a corrected calibration curve based upon the calibration curve and the offset.

9. A method comprising:
sending a heat signal to heat a substrate platen in a process chamber to a platen temperature;
measuring the platen temperature by a contact temperature measurement;

sending a first transfer signal to transfer a substrate to the substrate platen in the process chamber, when the substrate platen is at the platen temperature;

after a temperature-stabilization interval, at a transfer instance, sending a second transfer signal to perform a transfer of the substrate from the process chamber and place the substrate in a substrate position in a preheat station;

recording a zero time, the zero time corresponding to when the transfer of the substrate commences;

receiving a plurality of voltage readings as a function of time from an optical pyrometer after the zero time, the optical pyrometer measuring the substrate when the substrate is placed in the substrate position;

generating a voltage decay curve comprising the plurality of voltage readings, over a measurement interval; and extrapolating the voltage decay curve from the measurement interval to the zero time.

10. The method of claim 9, the generating the voltage decay curve comprising fitting a polynomial function to the plurality of voltage readings, the method further comprising:

determining a zero-time pyrometer voltage data, corresponding to the process temperature, by determining a pyrometer voltage corresponding to an intersection of the voltage decay curve at zero time with a horizontal line.

11. The method of claim 10, wherein the sending the heat signal to heat the substrate platen, the measuring the platen temperature, the sending the first transfer signal, the sending the second transfer signal, and the determining the zero-time pyrometer voltage data comprise a first calibration cycle, the method further comprising:

performing at least one additional calibration cycle, wherein the first temperature is increased between the first calibration cycle and the at least one additional calibration cycle.

12. The method of claim 11, wherein in each calibration cycle of the at least one additional calibration cycle, an additional zero-time pyrometer voltage data is generated, the method further comprising generating a calibration curve comprising a plurality of voltage-platen temperature data points, based upon the first calibration cycle and at least one additional calibration cycle.

13. The method of claim 12, further comprising:

recording a first substrate type for the substrate;

loading a process substrate into the preheat station;

determining the process substrate corresponds to the first substrate type;

heating the process substrate in the preheat station to a targeted temperature, using an experimental substrate temperature of the substrate recorded by an optical pyrometer, wherein the experimental temperature is determined by:

outputting an experimental voltage, generated in the optical pyrometer by emission from the process substrate; and mapping the experimental voltage to a corresponding substrate temperature on the calibration curve.

14. The method of claim 12, further comprising:

determining, for a targeted temperature range, an offset between platen temperature and substrate temperature, when the substrate is disposed on the substrate platen; and generating a corrected calibration curve based upon the calibration curve and the offset.

15. The method of claim 9, further comprising, before the sending the heat signal to heat the substrate platen:

sending a pre-warm signal to pre-warm the preheat station to a pre-warm temperature;

sending a load signal to load the substrate into the preheat station; and sending a set of control signals to preheat the substrate at the preheat station in an open loop mode.

16. A non-transitory computer-readable storage medium storing computer-readable program code executable by a processor to:

(a) send a heat signal to heat a substrate platen in a process chamber to a platen temperature;

(b) send a record signal to record the platen temperature by a contact temperature measurement;

(c) send a first transfer signal to transfer a substrate to the substrate platen in the process chamber, when the substrate platen is at the platen temperature;

(d) after a temperature-stabilization interval, at a transfer instance, send a second transfer signal to perform a transfer of the substrate from the process chamber and place the substrate in a substrate position in a preheat station;

(e) record a zero time, the zero time corresponding to when the transfer of the substrate commences;

(f) receive a plurality of voltage readings as a function of time from an optical pyrometer after the zero time, the optical pyrometer measuring the substrate when the substrate is placed in the substrate position;

(g) generate a voltage decay curve comprising the plurality of voltage readings, over a measurement interval;

(h) extrapolate the voltage decay curve to the zero time.

17. The non-transitory computer-readable storage medium of claim 16, the computer-readable program code to:

(i) fit a polynomial function to the plurality of voltage readings to generate the voltage decay curve; and (j) determine a zero-time pyrometer voltage data, corresponding to the process temperature, by determining a pyrometer voltage corresponding to an intersection of the voltage decay curve at zero time with a horizontal line.

18. The non-transitory computer-readable storage medium of claim 17, wherein execution of (a) through (j) comprises a first calibration cycle, the computer-readable program code to:

determine if the platen temperature is a highest temperature to be calibrated; and, when the platen temperature is not the highest temperature to be calibrated send a heat increase signal to increase the platen temperature, and perform at least one additional calibration cycle.

19. The non-transitory computer-readable storage medium of claim 18, wherein in each calibration cycle of the at least one additional calibration cycle, an additional zero-time pyrometer voltage data is generated, the computer-readable program code to:

generate a calibration curve comprising a plurality of voltage-platen temperature data points, based upon the first calibration cycle and at least one additional calibration cycle.

20. The non-transitory computer-readable storage medium of claim 16, the computer-readable program code to, before the heat signal:

send a pre-warm signal to pre-warm the preheat station to a pre-warm temperature;

send a load signal to load the substrate into the preheat station; and send a set of control signals to preheat the substrate at the preheat station in an open loop mode.

* * * * *